United States Patent
Adkins

(10) Patent No.: US 6,400,605 B1
(45) Date of Patent: Jun. 4, 2002

(54) METHOD AND SYSTEM FOR PULSE SHAPING IN TEST AND PROGRAM MODES

(75) Inventor: Kenneth C. Adkins, Fremont, CA (US)

(73) Assignee: Summit Microelectronics, Inc., Campbell, CA (US)

( * ) Notice: Subject to any disclaimer, the term of this patent is extended or adjusted under 35 U.S.C. 154(b) by 0 days.

(21) Appl. No.: 09/583,319

(22) Filed: May 30, 2000

(51) Int. Cl.$^7$ .............................................. G11C 16/04
(52) U.S. Cl. ............................. 365/185.18; 365/185.19
(58) Field of Search ........................ 365/185.18, 185.19

(56) References Cited

U.S. PATENT DOCUMENTS

| | | | |
|---|---|---|---|
| 5,856,946 A | * 1/1999 | Chan et al. | ............ 365/185.19 |
| 5,872,733 A | * 2/1999 | Buti et al. | ............. 365/185.19 |
| 5,963,462 A | * 10/1999 | Engh et al. | ............ 365/185.19 |
| 6,011,715 A | * 1/2000 | Pasotti et al. | ........... 365/185.19 |
| 6,034,895 A | * 3/2000 | Naura et al. | ........... 365/185.19 |

* cited by examiner

*Primary Examiner*—Trong Phan
(74) *Attorney, Agent, or Firm*—Fernandez & Associates, LLP

(57) ABSTRACT

The invention provides a single input pin on an integrated circuit chip that serves multiple functions during normal, test, and program modes. A first voltage detector detects a first predetermined high voltage level to place an integrated circuit in test mode. A second voltage detector detects a second predetermined high voltage level to place the integrated circuit in program mode. A high level switch is triggered to activate a pulse shaping circuit, which ramps up voltage gradually to prevent causing damage to programmable cells.

14 Claims, 7 Drawing Sheets

METHOD AND SYSTEM FOR PULSE SHAPING IN TEST AND PROGRAM MODES

BACKGROUND INFORMATION

1. Field of the Invention

The invention relates to integrated circuits, particularly to test and program modes in integrated circuit.

2. Description of Related Art

An integrated circuit undergoes verification and programming in program and test modes prior to release for shipment. The application of an external high voltage on one or more pins on a chip is a common approach to place a chip in test modes. For integrated circuits that are manufactured with a low pin count, a single pin may be designated with more than one function due to the limitation of the total pin count. This is particular true for pins that are assigned with test mode functions. Rather than dedicating a particular pin for usage solely during a program mode or test mode, that pin can be more widely utilized by placing another function on the same pin. Also in a conventional approach, on-chip programmable electrically erasable programmable read-only memory (EEPROM) bits are written with an internal charge pump for generating the programming voltage. However, the cost of an IC is increased with the additions of charge-pumps and high pin counts.

Accordingly, it is desirable to have a method and system for using a single pin of an IC that provides multiple functions during test modes.

SUMMARY OF THE INVENTION

The invention provides a single pin on an integrated circuit chip that serves multiple functions for placing the chip in test and program modes. A first predetermined high voltage level is applied to a test input pin to place the chip in test mode. A second predetermined high voltage level is applied to the test input pin to provide the programming voltage necessary to program a chip. Preferably, the integrated circuit is programmable that employs non-volatile memories with electrically erasable ($E^2$) cells.

To preventing damage caused to internal circuits and the EEPROM, the incoming high-voltage from the test input pin is introduced gradually by a pulse shaping circuit. The pulse-shaping circuit provides a smooth transition when input voltage increases to the second predetermined high-level voltage.

The test input pin of the programmable chip connects to a first voltage level detector, a second voltage level detector, and a high-level switch. The first voltage sensor detects when the test input pin reaches a first predetermined voltage level. When the test input pin has reached the first predetermined voltage level, the programmable chip is in test mode. During the test mode, the programmable chip may interpret any combination of data or instructions differently than while operating under a normal mode. Sufficient gap between the first predetermined voltage level in test mode and the required voltage level in normal mode is necessary to prevent cross-over reading or writing data between the test and normal modes.

The second voltage level detector detects a second predetermined voltage level. Preferably, the second predetermined voltage level is set at a higher voltage level than the first predetermined voltage level. The function of the second voltage sensor is provide a programming voltage for storing information in a non-volatile EEPROM. When the second voltage sensor detects the test input pin near or at the second predetermined voltage level, a high-voltage pass gate is switched ON, placing the chip in program mode and allowing the programming voltage into the chip.

Advantageously, the use of the dual-level voltage sense and pulse-shaping circuits results in a smaller dimension of IC, with a lower pin count and smaller die size by eliminating a charge pump and related circuits. An integrated circuit that is programmable, such as employing electrical erasable cells, provides an advantage to program a chip after packing, as opposed to during the fabrication process at wafer level.

DETAILED DESCRIPTION OF PREFERRED EMBODIMENT

Figure 1:
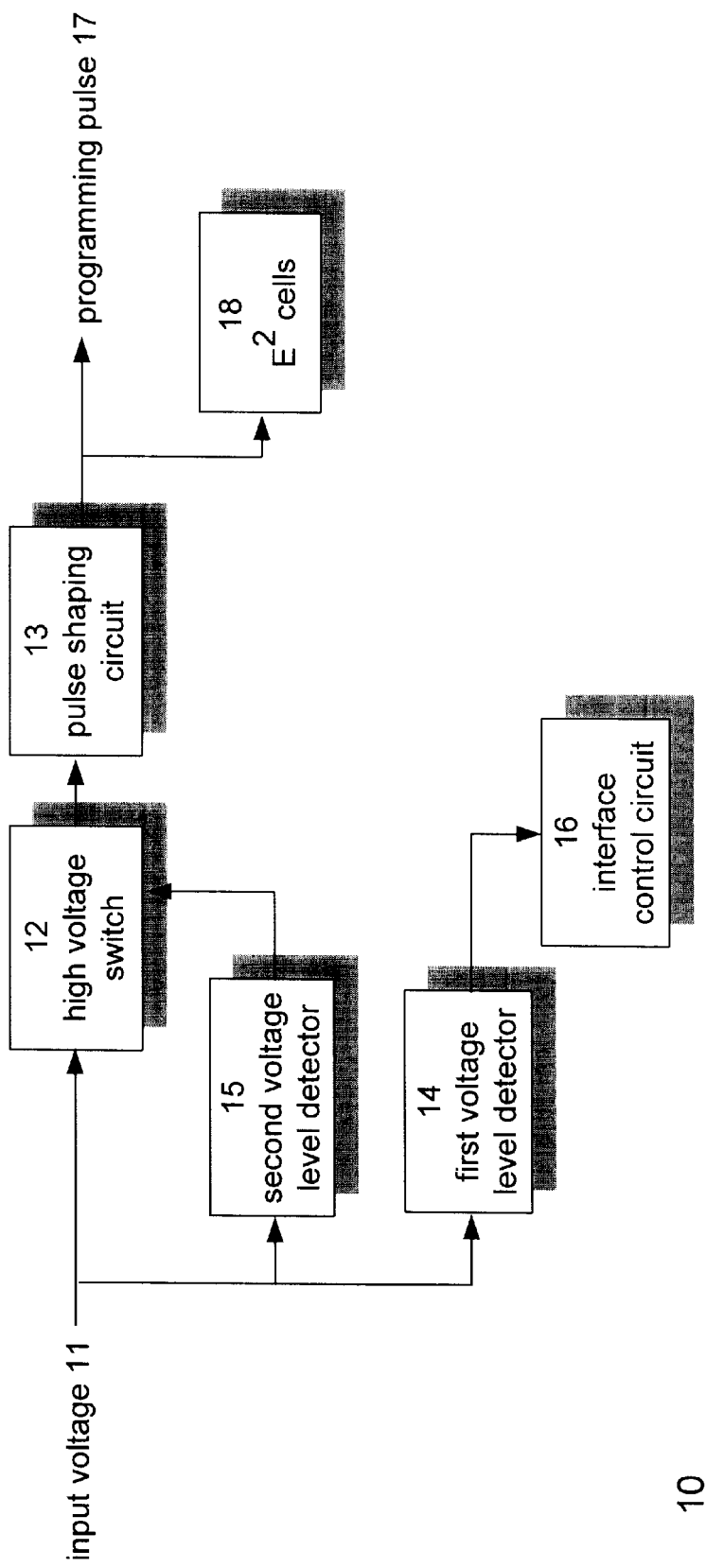
FIG. 1 is an architectural diagram illustrating the dual level voltage sense and pulse shaping circuits in accordance with the present invention.

FIG. 1 is a block diagram illustrating an integrated circuit 10. An input voltage 11 is commonly fed to a high level switch 12, a first voltage level detector 14, and a second voltage level detector 15. Input voltage 11 is also referred to as test input pin or test input voltage. A pulse shaping circuit 13 couples to high-level switch 12 to provide a smooth transition when the voltage of test input pin increases to the second predetermined high voltage level to generate a programming pulse 17. While in test mode and not yet in a programming mode, an interface control circuit 16 allows test data or address information to enter into integrated circuit 10 for functional verification.

During a normal-mode operation, the input voltage 11 fluctuates between 0 to 5 volts, representing the nominal Vcc operating range. At that voltage range, the input voltage 11 is not at a sufficient high voltage level for the detection by either first voltage level detector 14 or second voltage level detector 15. Consequently, the high-level switch 12 is in an OFF state. To enter a test mode of integrated circuit 10, the test input voltage 11 is increased to a high-level voltage, e.g. 10 volts. The 10 volt in this instance represents a voltage level in which the first voltage level detector 14 detects test input voltage 11.

Figure 2:
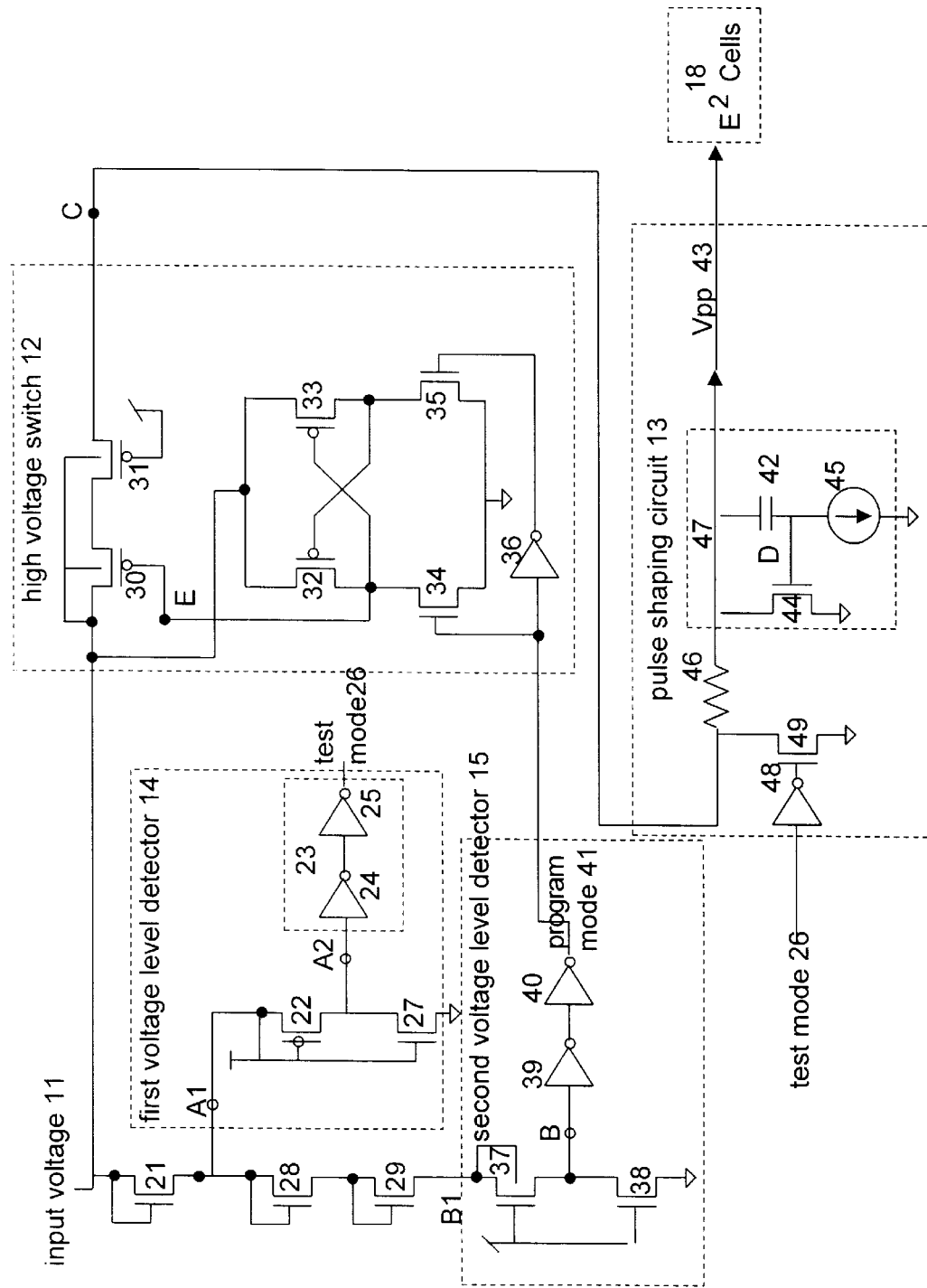
FIG. 2 is a schematic diagram illustrating the dual level voltage sense and pulse shaping circuits in accordance with the present invention.

FIG. 2 is schematic diagram illustrating the dual-level voltage sense and pulse shaping circuits. Input voltage 11 is fed into the first voltage level detector 14 via transistor 21 to the source and bulk of a p-channel transistor 22. The gate of transistor 22 is held at Vcc=5V. The drain of the p-channel transistor 22 feeds to a weak n-channel transistor 27, whose gate is also held at Vcc. When input level rises one p-channel threshold above Vcc, p-channel transistor 22 begins to turn ON. When the input level is sufficiently high enough to overpower weak n-channel transistor 27, a sensor 23, which include two inverters 24 and 25, is asserted high to generate a test mode signal 26.

The input voltage of the first voltage level detector 14 is dropped one diode-connected n-channel MOSFET threshold level, or about 1.5V, below test input pin 11. For the output of the first voltage level detector 14 to asserted high, test input pin 11 should rise to approximately one n-channel threshold, plus one p-channel threshold, about 0.8V, plus a bit more voltage above Vcc, about 0.7V to overcome weak n-channel transistor 27. Therefore, the test mode signal 26 becomes active around 8V, which represents the sum of 5V (Vcc)+1.5V+0.8V+0.7V. As for the second voltage level detector 15, the input is dropped an additional two diodes. Thus, test input pin 11 should reach at least 11V before the second voltage level detector 15 becomes active.

In one embodiment, test input pin 11 rises to 9V or 10V, which may be sufficiently high to trip the output of first voltage level detector 14, but not high enough to trip the output of second voltage level detector 15. The output of first voltage level is detector 14 can be used to signal interface control circuit 16 to allow incoming data and addressing associated with test configuration inputs. After integrated circuit 10 has performed the test functions in test mode, test voltage input 11 is increased to the next target voltage level, e.g. 16V, to place integrated circuit 10 in a program mode. At which time, the output of second voltage level detector 15 becomes active, which indicates to high-level switch 12 to turn ON and allow the 16V programming voltage into integrated circuit 10.

High voltage switch 12 serves as a level shifter whose output drives the gate of a high-voltage p-channel transistor 30. The source and bulk of p-channel transistor 30 is connected to test input pin 11. Until the voltage level on test input pin 11 is sufficiently high, the output of second voltage level detector 15 remains low, which in turn keeps the gate of p-channel transistor 30 high, or in the OFF position. However, when program mode signal 41 goes high, this drives the gate of p-channel transistor 30 low, which allows the potential on test input pin 11 to reach to node C and the input of pulse shaping circuit 13.

For p-channel transistors, a high-voltage turns a transistor to an OFF state, while a low-voltage turns a transistor to an ON state. For n-channel transistors, a high-voltage turns a transistor to an ON state, while a low-voltage turns the transistor to an OFF state. During normal operation, an output E is high, which keeps the p-channel transistor 30 OFF. When programming mode is OFF, a transistor 34 is low, a transistor 35 is inverted and is high, a transistor 32 is low, and a transistor 33 is high. In a program mode which high-level switch 12 switches to high, transistor 34 goes to high, transistor 35 goes to low, output E goes low, and allows p-channel transistor 30 to turn ON. Node C was held OFF for a long time. As soon as high-level switch 12 switches, test input voltage 11 passes through high-level switch 12, across node C, and to pulse-shaping circuit 13.

Pulse-shaping circuit 13 is designed to protect potential damage caused to $E^2$ cells 18 in integrated circuit 10 from too steep of slope in high voltage. To prevent sudden jump in high voltage from normal mode to test mode, and from test mode to program mode, pulse shaping circuit 13 ramps up the high-level voltage gradually.

Vpp 43 is kept in an OFF state during normal operation while program mode signal 41 is not asserted. When test input voltage 11 ramps up to a first predetermined high-voltage level as set by the first voltage level detector 14 to enter into test mode, or ramps up to a second predetermined high-voltage level as set by the second voltage level detector 15 to enter into programming mode, a transistor 49 is switched to an OFF state.

Pulse-shaping circuit 13 is constructed with a capacitor 42, with one end connected to a Vpp output (signal to be shaped) 43 and the other end commonly connected to the gate of a shunt transistor 44 and a current source 45. A series resistor 46 between an input from high level switch 12 and output of Vpp 43 for limiting the electrical current required to shunt the output to ground. When the gate terminal of shunt transistor 44 is pulled to ground, the Vpp output 43 is allowed to rise due to the potential at node C. However, as the Vpp 43 rises, the Vpp 43 couples up the gate terminal of shunt transistor 44 via capacitor 42. If Vpp 43 rises too quickly, the shunt transistor 44 begins to turn ON and pull Vpp back to the proper voltage level.

The negative feedback loop 47 keeps a slew rate of Vpp 43 fixed at ramp current divided by capacitance. In one embodiment, the slew rate is set at 32,000 V/s (16V/500 us), capacitor 42 is selected with a value of 10 pF, and ramp current 63 is set at 320 nA. When Vpp 43 reaches full scale, i.e. the second predetermined high voltage level, the gate terminal of shunt transistor 44 shuts-off completely. Vpp 43 can be used to program non-volatile cells such as EEPROM cells. After an appropriate amount of programming time, test input pin 11 is pulled low, which internally shuts OFF from further programming.

Figure 3:
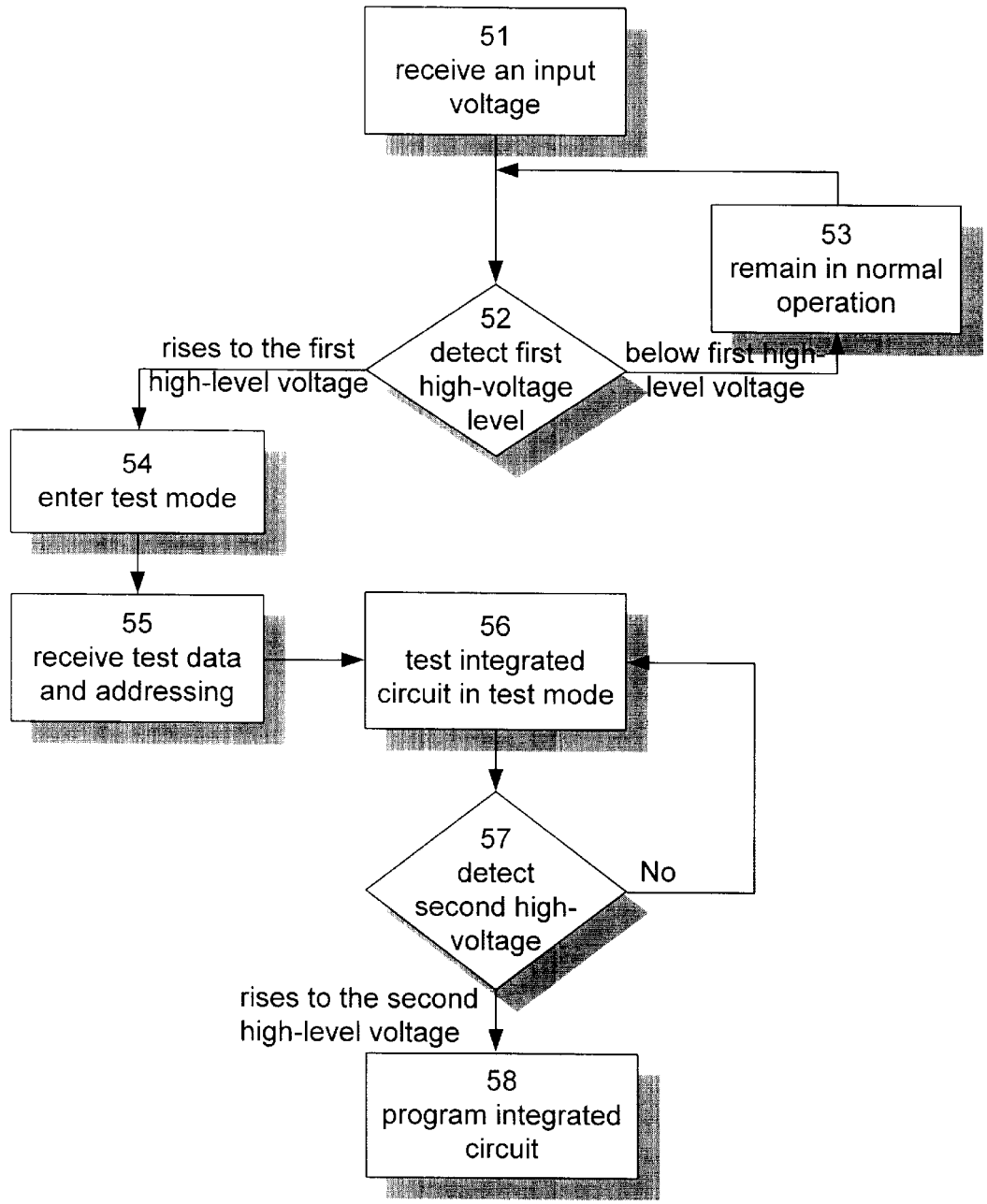
FIG. 3 is a flow diagram illustrating the dual level voltage sense process in accordance with the present invention.

FIG. 3 is a flow diagram illustrating a dual level voltage sense method 50. Integrated circuit 10 receives 51 input voltage 11 for feeding to first voltage level detector 14, second voltage level detector 15, and high-voltage switch 12. First voltage level detector 14 detects 52 if input voltage 11 is sufficiently high to reach a first predetermined high voltage level, e.g. 10 volts. If input voltage 11 has reached a sufficient voltage level as set forth by the first predetermined high-level voltage, integrated circuit 10 enters 54 into a test mode. Data and addressing information are received 55 via interface control circuit 16. Integrated circuit 10 undergoes 56 testing or verification process for a period of time. However, if input voltage has not risen sufficiently to near or at first predetermined high voltage, integrated circuit 10 remains 53 in normal mode.

Meanwhile, second voltage level detector 15 detects 57 if test input voltage 11 rises sufficiently to reach a second predetermined voltage level. Integrated circuit 10 remains in test mode if test input voltage 11 is below the second predetermined voltage is level but above the first predetermined voltage level. Once test input voltage 11 has reached the second predetermined voltage level, node B2 is asserted high, which enables inverters 39 and 40, setting 58 integrated circuit 10 in program mode.

Figure 4A:
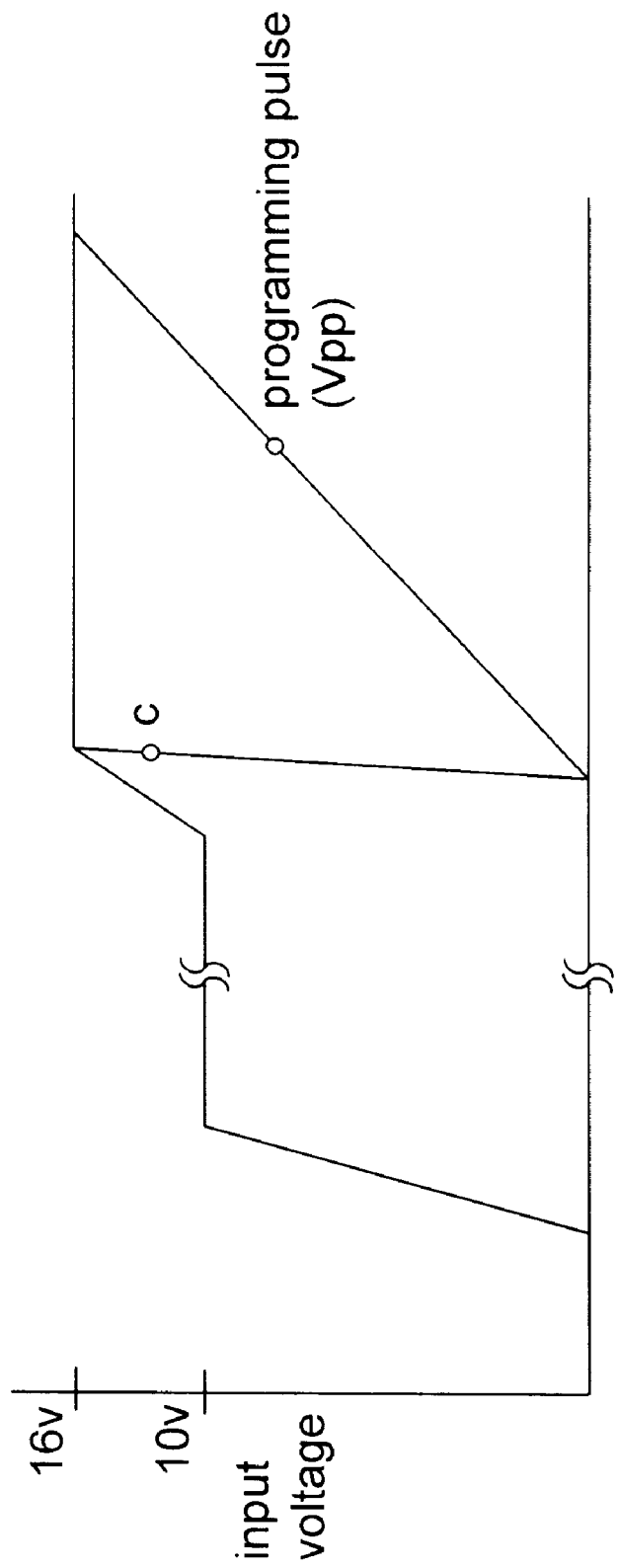
FIGS. 4A–4D are graphical diagrams illustrating the dual level voltage sense and pulse shaping circuits in accordance with the present invention.

FIG. 4A is a graph showing input voltage 11 rises to 10 volts to place integrated circuit 10 in test mode. Integrated circuit 10 remains near or at 10 volts for a period of time until there is an increase in input voltage 11 to place integrated circuit 10 in program mode. Between the transition from 10 volts to 16 volts, transistor 32 in high level switch 12 is turned ON to allow input voltage 11 to pass through node C. This in turn increases Vpp 43 voltage in pulse shaping circuit 13 to put integrated circuit 10 in program mode.

Figure 4B:
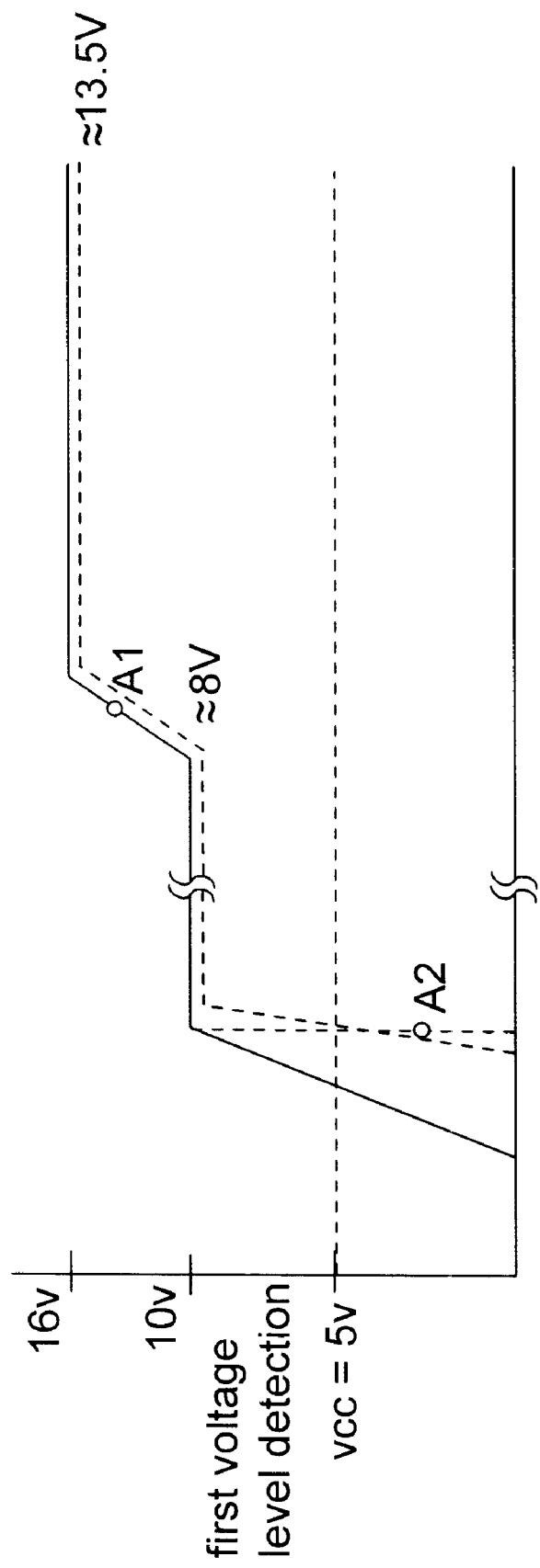

FIG. 4B shows the voltage levels at nodes A1 and A2 in first voltage level detector 14. Node A1 is triggered about one-diode down, or about 1–1.5 volts down, from 10 volts. Once node A2 hits a specified voltage level, e.g. about 8 or 8.5 volts, the voltage at node A2 increases and asserts test mode signal 26 via inverters 25 and 26 Node A2 is held firmly at zero until the voltage reaches a specified threshold. At that point, the voltage at A2 shoots up quickly. When node A2 is asserted high, around 8 volts, test model signal 26 is also asserted high.

Figure 4C:
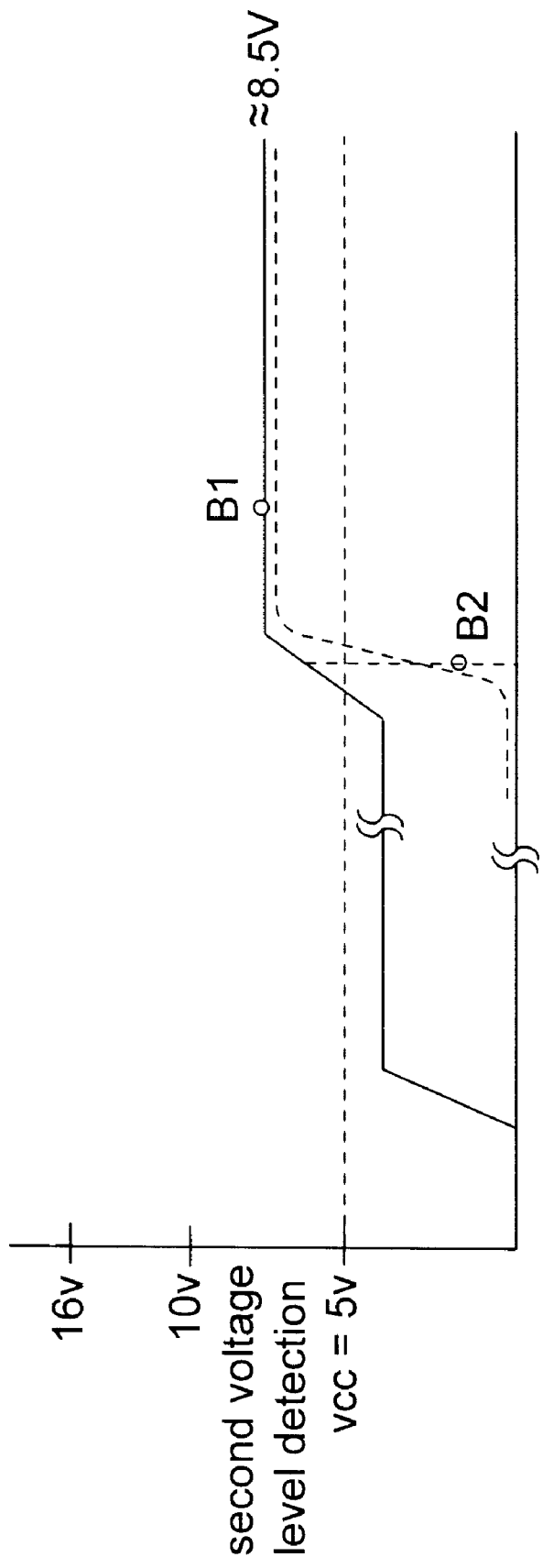
Figure 4D:
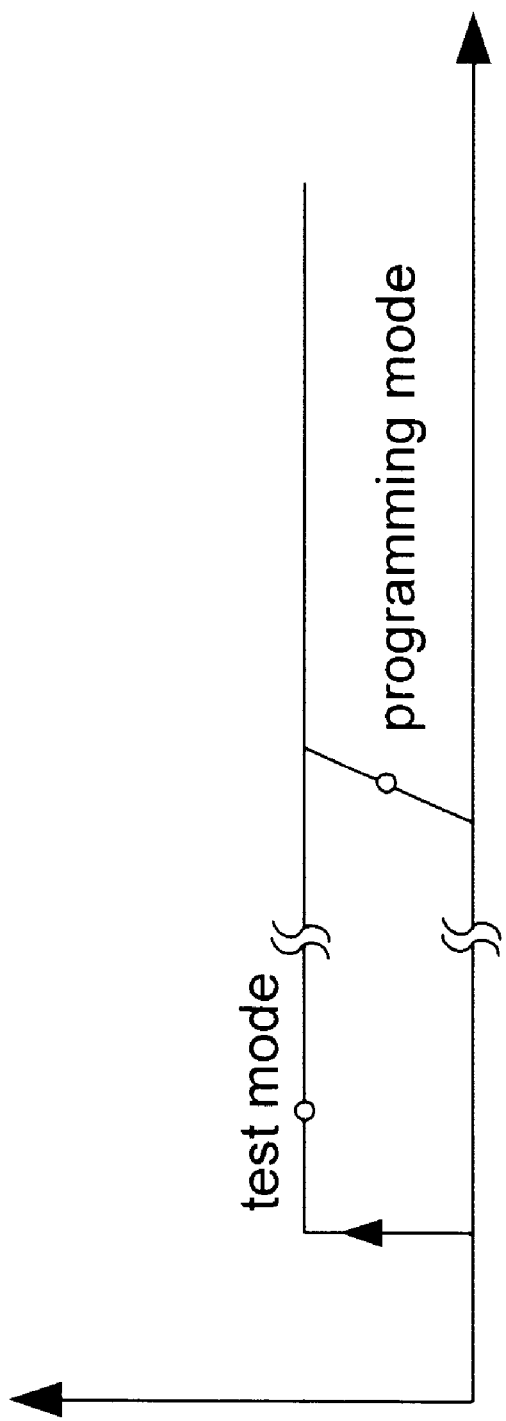

The input signal 11 remains constant at 10-volts for a period of time to allow time for other pins to enter clock and data into a chip in setting up the conditions in test mode. Once the data is set up, the input voltage 11 is increased to a second high voltage level, e.g. 16 volts. At 16 volts, integrated circuit 10 changes from test mode to program mode. During the program mode, the data that was entered in integrated circuit 10 during test mode is now programmed in the nonvolatile memories of integrated circuit 10. The programming mode starts when node B2 switches to high, as shown in FIG. 4C. FIG. 4D shows integrated circuit chip 10 in test mode and program modes.

The above embodiments are only illustrative of the principles of this invention and are not intended to limit the invention to the particular embodiments described. For example, one of skilled in the art should recognize that additional pin functions can be added to input pin 11 without departing from the spirit in the present invention. Moreover, the first and second predetermined high voltages can be set at various levels for suitable operation in an integrated circuit chip. Accordingly, various modifications, adaptations, and combinations of various features of the described embodiments can be practiced without departing from the scope of the invention as set forth in the appended claims.

I claim:

1. An integrated circuit, comprising:
   an input pin for receiving a predetermined high-voltage program level during a program mode;
   a first voltage-level detector for detecting a predetermined high-voltage test level, the integrated circuit entering into a test mode when an incoming voltage signal at the input pin rises to the predetermined high-voltage test level;
   a second voltage level detector, coupled to the first voltage-level detector, for detecting the predetermined high-voltage program level, the integrated circuit entering the program mode when an incoming voltage at the input pin rises to the predetermined high-voltage program level; and
   a high impedance circuit for gradually ramping up the predetermined high-voltage program level preventing damage caused to electrical erasable cells in the integrated circuit.

2. The integrated circuit of claim 1, wherein the high impedance circuit comprises:
   a capacitor having a first end and a second end;
   a transistor having a first end, a second end, and a third end; and
   a current source having a first end and a second end, the first end of the current source coupled commonly the second end of the capacitor and the second end of the transistor, the second end of the current source coupled to a ground, the first end of the capacitor coupled commonly to a Vpp voltage and the first end of the transistor, the third end of the transistor coupled to a ground.

3. The integrated circuit of claim 1, further comprising a resistor having a first end coupled to the input pin, and a second end coupled commonly to the first end of the transistor, the first end of the capacitor, and the Vpp voltage.

4. The integrated circuit of claim 1, where the high impedance circuit comprises a negative feedback loop.

5. The integrated circuit of claim 1, further comprising a high level switch circuit for receiving the predetermined high-voltage program level from the input pin.

6. The integrated circuit of claim 1, wherein the input pin serves a first function for receiving a Vcc voltage between 0 to 5 volts.

7. The integrated circuit of claim 1, wherein the input pin serves a second function for receiving a predetermined high-voltage program level.

8. The integrated circuit of claim 1, wherein the input pin serves a third function for receiving a predetermined high-voltage test level.

9. The integrated circuit of claim 7, wherein the predetermined high-voltage test level is approximately 8 to 10 volts.

10. The integrated circuit of claim 8, wherein the predetermined high voltage level is approximately 16 volts.

11. A method for programming an integrated circuit, comprising the steps of:
    detecting a predetermined high-voltage test level from an input signal to place the integrated circuit in test mode;
    detecting a predetermined high-voltage program level from the input signal to place the integrated circuit in program mode; and
    ramping up gradually of the predetermined high-voltage program level preventing causing damage to electrical erasable cells in the integrated circuit.

12. The method of claim 11, wherein the input signal comprises a Vcc voltage between 0 to 5 volts.

13. The method of claim 11, wherein the predetermined high-voltage program signal is approximately 16 volts.

14. The method of claim 11, wherein the input signal comprises a predetermined high-voltage test level is approximately 8 to 10 volts.

* * * * *